United States Patent [19]
Dunn et al.

[11] Patent Number: 5,912,507
[45] Date of Patent: Jun. 15, 1999

[54] SOLDERABLE PAD WITH INTEGRAL SERIES TERMINATION RESISTOR

[75] Inventors: Gregory J. Dunn, Arlington Heights; Lawrence E. Lach, Chicago; Daniel R. Gamota, Palatine, all of Ill.

[73] Assignee: Motorola, Inc., Schaumburg, Ill.

[21] Appl. No.: 09/018,363

[22] Filed: Feb. 4, 1998

[51] Int. Cl.$^6$ ................................................. H01L 23/48
[52] U.S. Cl. ..................... 257/767; 257/772; 257/780; 361/779
[58] Field of Search ................................ 257/536, 537, 257/546, 577, 693, 767, 769, 773, 778, 780, 784, 786; 361/779, 811, 738

[56] References Cited

U.S. PATENT DOCUMENTS 5,468,995  11/1995  Higgins ..................................... 257/778

Primary Examiner—Tom Thomas
Assistant Examiner—Luan Thai
Attorney, Agent, or Firm—Douglas D. Fekete

[57] ABSTRACT

A microelectronic assembly, such as a surface-mount device or a ball-grid array (BGA) package, has one or more integral resistors. The integral resistors are incorporated into one or more of the microelectronic assembly's electrical leads or connections. The integral resistors preferably terminate in a solderable pad. For example, the BGA package may include an IC chip and interposer. A terminal is located on a surface of the IC chip, on a surface of the interposer, or on the surface of the substrate to which the BGA is mounted. An electrically-resistive material overlies the terminal and electrically couples the terminal to a bond pad, thereby defining an integral resistor. The integral resistors reduce electrical resonances and reflections that may otherwise degrade the signal integrity and reliability of the electrical system employing the device; hence, reduce or eliminate the requirement for discrete resistors for the microelectronic assembly.

38 Claims, 2 Drawing Sheets

SOLDERABLE PAD WITH INTEGRAL SERIES TERMINATION RESISTOR

This invention was made with Government support under Agreement No. F33615-96-2-1838 awarded by DARPA. The Government has certain rights in the invention.

FIELD OF THE INVENTION

The present invention generally relates to microelectronic assemblies having integrated passive circuit elements. More particularly, this invention relates to printed circuit boards, surface-mount devices, or ball-grid array (BGA) packages incorporating integral series termination resistors.

BACKGROUND OF THE INVENTION

Prior art surface-mount devices include ball grid array (BGA) packages. Ball-grid array packages are surface-mount devices including an integrated circuit (IC) chip and an interposer. The integrated circuit chip is either wire bonded or flip-chip mounted to bond pads on a surface of the interposer. The interposer is generally a small circuit board having bumped solderable pads on the surface of the interposer opposite from the integrated circuit chip. The bond pads and solderable pads of the interposer are electrically connected by metal traces and vias. Solder bumps on the solderable pads serve as interconnects between the interposer and a conductor pattern on a substrate, for example, a printed wiring board (PWB).

For high-speed digital applications, the chip, package (i.e. interposer) and board interconnections of a BGA can exhibit electrical resonances and reflections that degrade signal integrity and electrical system reliability. Such degradations of signal quality are particularly of concern with higher signal frequencies and with digital signals that exhibit shorter rise times. Where low power supply voltages for circuits are employed, electrical resonances and reflections are of great concern because reducing power supply voltages typically requires corresponding reductions in noise levels to avoid detrimental affects on signal integrity.

In the past, discrete termination resistors, in parallel or in series with the signal path, have been employed to eliminate or substantially reduce these resonances and reflections. However, discrete resistors have inherent drawbacks or limitations involving cost, weight, manufacturing complexity, and circuit density. Thus, a need exists for reducing electrical resonances and reflections in high-speed digital applications without sacrificing circuit density or incurring complex manufacturing procedures.

SUMMARY OF THE INVENTION

A preferred embodiment of the present invention is directed toward a microelectronic assembly including a substrate, a surface-mount device, an electrical connection, and a series termination resistor. The substrate and the surface-mount device are electrically connected by the electrical connection. The series termination resistor is preferably affixed to the surface-mount device. The series termination resistor contains an electrically resistive material that optimally comprises an electrically conductive particulate filler dispersed in a polymeric resin. The electrically resistive material forms a resistive layer, which is preferably interfaced through a noble metal layer.

In one embodiment of the present invention, a surface-mount device, preferably a BGA package, incorporates an integral resistor or a series termination resistor. The ball-grid array package comprises an interposer, an integrated circuit die, a terminal, a resistive layer, a bond pad and a solder bump. The interposer has a first surface and a second surface located opposite from the first surface. The integrated circuit die is mounted on the first surface. The terminal is disposed on the second surface and electrically coupled to the die. The resistive layer of electrically resistive material overlies the terminal. The resistive material comprises resin and electrically conductive particles. A bond pad is affixed to the resistive material and is electrically coupled to the terminal via the resistive layer to form an integral resistor. A solder bump is optimally bonded to the bond pad. The solder bump is adapted to receive an electrical connection to the BGA package.

In alternate embodiments, the integral resistor may be incorporated into a BGA package at various locations including an electrical connection between the IC chip and the interposer. In still another alternate embodiment, the integral resistor may be located on a substrate (i.e. circuit board) and associated with electrical connection between the interposer and the substrate.

The integral resistor may be used to reduce unwanted resonances and signal reflections that may otherwise degrade the reliability of the microelectronic assembly. The integral resistor of the microelectronic assembled may be used to replace or eliminate discrete resistors associated with many prior art microelectronic assemblies. Therefore, the microelectronic assembly, incorporating the integral resistor, may be used to increase circuit density relative to circuits using discrete resistors.

DETAILED DESCRIPTION OF THE PREFERRED EMBODIMENT

Figure 1:
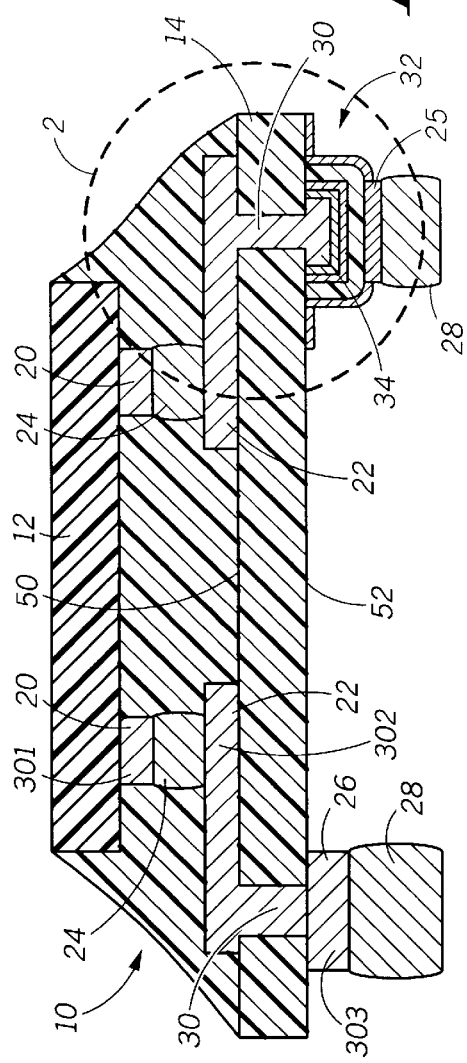
FIG. 1 is a cross-sectional view of a microelectronic assembly, including a surface-mount device with a series termination resistor associated with a solderable pad.
Figure 3:
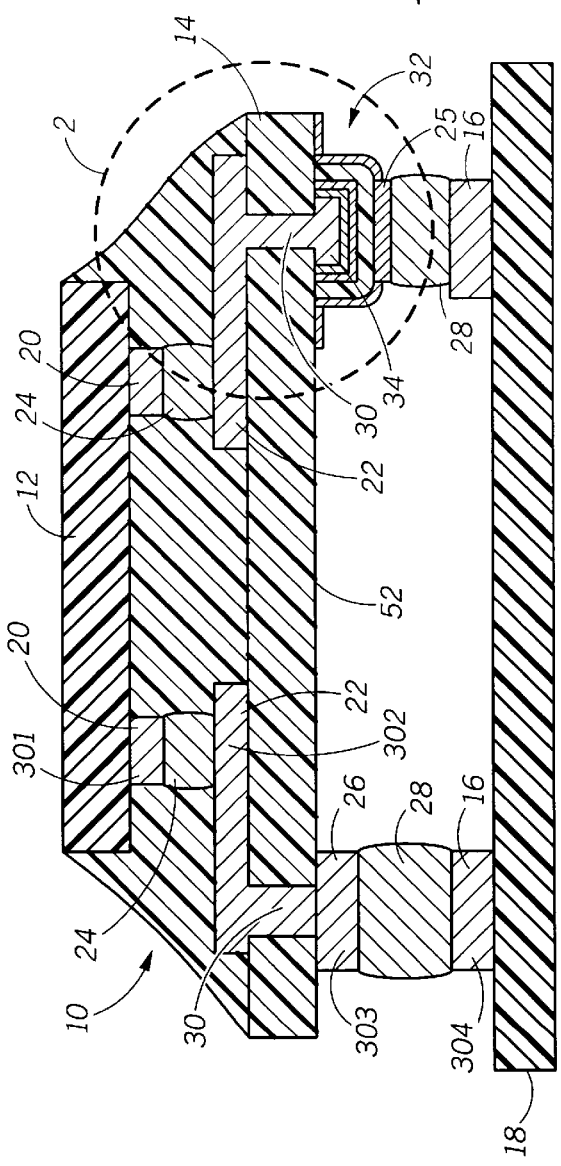
FIG. 3 is a cross-sectional view of a surface-mount device mounted on a substrate.
Figure 2:
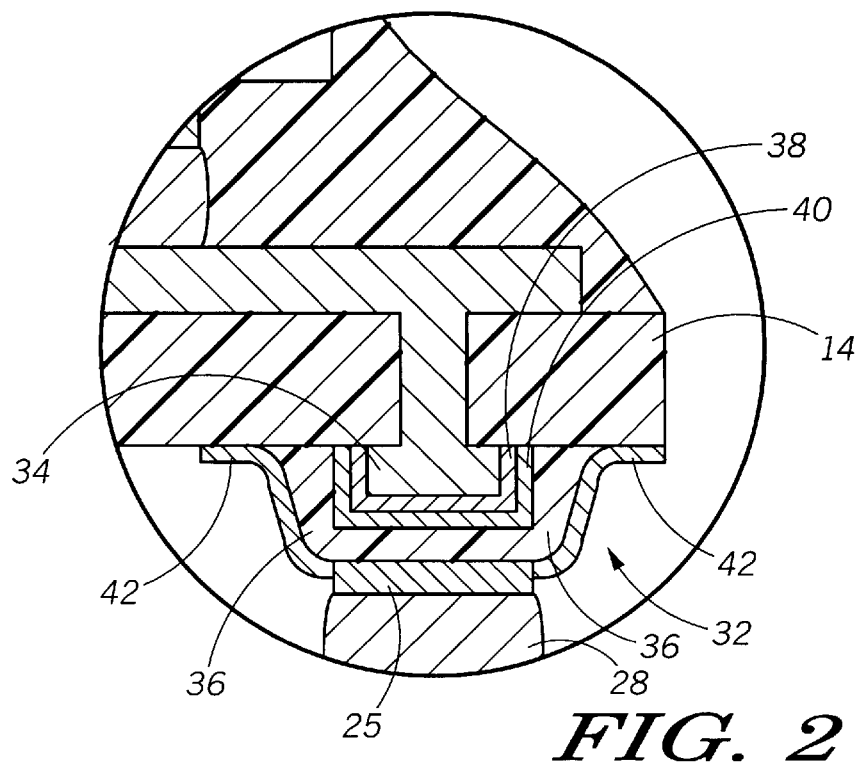
FIG. 2 is an enlarged view of the circular region identified as reference numeral 2 in FIG. 1.

FIG. 1 through FIG. 3 show a microelectronic assembly illustratively as a ball grid array (BGA) package 10. The BGA package 10 includes a die 12, such as an IC chip, mounted to an interposer 14. As best shown in FIG. 3, vias 30 through the interposer 14 may provide electrical connection between the die 12 and a substrate 18. The substrate 18 can be of any suitable type, such as a circuit board, a printed wiring board, a flexible circuit, a ceramic, silicon substrate, or the like; or a dielectric layer or a conductive foil of a multilayer circuit. While FIG. 1 illustrates a BGA 10 with the die 12 shown as being flip-chip mounted to the interposer 14, those skilled in the art will appreciate that the teachings of this invention are applicable to wire-bond BGA packages as well as other surface-mount devices, and that numerous variations and modifications are possible, all of which are within the scope of this invention.

According to this invention, electrical resonances and reflections associated with interconnections required by the microelectronic assembly when used in a high-speed digital application are eliminated or at least substantially reduced by incorporating an integral series termination resistor at one or more of the electrical connections of the BGA 10. FIG. 1 and FIG. 3 identify the various electrical connections associated with the BGA 10 that can be modified to incorporate integral resistors as a first potential resistor location 301, a second potential resistor location 302, a third potential resistor location 303, and a fourth potential resistor location 304. "Modification" of the electrical connections refers to altering the electrical connections of the BGA during the manufacturing process of the BGA and not changing an existing already-manufactured BGA that conforms to FIG. 1.

The first potential resistor location 301 and the second potential resistor location 302 are located between the die 12 and the interposer 14. The first potential resistor location 301 is associated with the solder pads 20 on the die 12. If the first potential resistor location 301 is used, the manufacturing of one or more solder pads 20 is preferably modified to incorporate an integral resistor in accordance with the teachings of the present invention. The second potential resistor location 302 is associated with the conductor 22 on a first surface 50, or an upper surface, of the interposer 14. The solder bump connections 24 adjoin both the first potential resistor location 301 and the second potential resistor location 302. If the second potential resistor location 302 is used, the manufacturing of the conductor 22 is preferably modified to incorporate the integral resistor of this invention.

The third potential resistor location 303 and the fourth potential resistor location 304 are located between the interposer 14 and the substrate 18 as best illustrated in FIG. 3. The third potential resistor location 303 is associated with the bond pads 26 on a second surface 52, or a lower surface, of the interposer 14, while the fourth potential resistor location 304 is associated with the conductors 16 on the substrate 18. The solder bumps 28 may adjoin both the third potential resistor location 303 and the fourth potential resistor location 304. If the third potential resistor location 303 is used, the manufacturing of one or more bond pads 26 is preferably modified to incorporate an integral resistor in accordance with the teachings of the present invention. Similarly, if the fourth potential resistor location 304 is used, the manufacturing of one or more conductors 16 is preferably modified to incorporate an integral resistor in accordance with the teachings of the present invention.

While it is feasible that the manufacturing of any one of the above interconnections could be modified in accordance with this invention, in a preferred embodiment the bond pads 26 of the interposer 14 are modified at the third potential resistor location 303 for various practical reasons, such as compatibility of low-cost printing and patterning techniques with the pitch and diameter of the bond pads 26, and avoiding complicating the yield and testing of the substrate 18. While FIG. 1 and FIG. 2 illustrate modifications to the bond pads 26 on the bottom surface of the interposer 14, the following discussion is generally applicable to similar modifications that could be made to the solder pads 20 on the die 12, the conductors 22 on the upper surface of the interposer 14, or the conductors 16 on the substrate 18 at the first potential resistor location 301, the second potential resistor location 302, the third potential resistor location 303, or the fourth potential resistor location 304.

The bond pad 26 shown in FIG. 1 could be replaced by the integral resistor 32 associated with a solderable bond pad 25 of FIG. 2. The bond pad 25, an electrically resistive layer 36, and a terminal 34 cooperate to form the integral resistor 32 on a second surface 52 of the interposer 14.

Generally, the resistive material for the resistive layer 36 comprises electrically conductive particles dispersed in a polymeric resin or a plastic resin. The conductive particles may comprise an electrically conductive particulate filler, such as metallic particles. The conductive particles preferably comprise carbon particles, which may be, for example, carbon black powder. Accordingly, the resistive material for the resistive layer 36 can be any suitable thick-film resistive ink composition, such as a polymer thick-film (PTF) ink of the type comprising a polymer matrix in which carbon particles are dispersed to achieve a desired level of conductivity. Polymer thick-film (PTF) inks may be deposited by screening, stenciling, curtain coating, and the like. Such techniques and compositions enable suitable resistance values to be readily obtained for resistors formed in accordance with this invention without requiring modifications to the surface-mount device that would adversely affect processing and operational considerations. A preferred ink composition known in the art contains carbon particles dispersed in a heat-curable polymer, preferably a phenolic resin, although other materials could be substituted.

The resistivity or specific resistance of the electrically resistive material may be defined as the resistance between opposite faces of a one centimeter cube composed of the electrically resistive material. The resistivity of the cured resistive material generally falls within a range from approximately 5 ohm-centimeters to approximately 100 ohm-centimeters. Optimally, the resistivity of the cured resistive material falls within a range from approximately 10 ohm-centimeters to approximately 50 ohm-centimeters. The foregoing resistivities are suitable for forming compact resistors with values around 50 to 75 ohms.

The conductive elements (i.e. terminals) of the integral resistor 32 can be formed by plating, screening, stenciling, photodefining, jetting, etching and other known deposition and patterning techniques. The terminal 34 may be formed by such techniques as plating, subtractive etching or any other suitable method known in the art. With further reference to FIG. 2, the terminal 34 is preferably plated by the intermediate metal layer 38 and a noble metal layer 40. The terminal 34 is preferably composed of copper, which is plated or coated by an intermediate metal layer 38. The intermediate layer 38 may also be referred to as a nickel layer, if the intermediate layer is composed of nickel. In turn, the noble metal layer 40 preferably plates or coats the intermediate layer 38 to provide for solder wettability and stable resistor terminations. Noble metals include gold, silver, palladium, and platinum, or related alloys which offer corrosion-resistant properties for the interface between the noble metal layer 40 and the resistive layer 36. The layers 38 and 40 are each preferably deposited on the surface of the terminal 25 to any suitable thickness, e.g., about 0.1 to about 10 micrometers, by any suitable process. A screening mask or stencil can then be used to deposit the thick-film ink on the terminal 34 and its layers 38 and/or 40, preferably such that the entire terminal 34 is covered as shown in FIG. 2. The noble metal layer 40 preferably interfaces with the resistive material to prevent corrosion and to provide a reliable, stable resistance over the lifetime of the microelectronic assembly.

While both the intermediate layer 38 and the noble metal layer 40 are shown, in alternate embodiments either the intermediate layer 38 or the noble metal layer 40 could be used alone to plate an alternate terminal. In particular, if the noble metal layer is silver, the noble metal layer may be plated directly onto an alternate terminal composed of copper without tile intermediate layer. In this entire specification, the term "alternate", preceding an element of the present invention, refers to the use of that element in any alternate embodiment. For example, the "alternate terminal" is described above with reference to an alternate embodiment.

The bond pad 25 and the bond pad 26 are preferably electroless nickel, electroless copper, or another solderable metal, although other materials and processes may be used. The bond pad 25 interfaces the resistive layer 36 and is preferably electrolessly plated onto the resistive layer 36 after the resistive layer 36 is established. An optional solder mask 42 is shown as overlying the resistive layer 36, through which the bond pad 25 is exposed. The solder mask is preferably a dielectric such as a polymer.

In an alternate embodiment an alternate bond pad may be plated or coated with a noble metal layer (not shown). For example, if the alternate bond pad is made from copper, the alternate bond pad optionally incorporates a nickel metal layer plating the copper and a noble metal layer plating the nickel layer in the same way in which terminal 34 is plated with the layers 38 and 40.

As is conventional, wires used in wire bonding interconnect techniques and solder used in flip-chip attachment techniques will readily bond to the surface of the bond pad 26 and bond pad 25 when formed of any of the above-noted metals. Accordingly, the interposer 14 can be connected to the conductors 16 on the substrate 18 by flip-chip attachment, by a conductive adhesive, or by known wire bonding methods. If the former is employed, the solder bumps 28 are formed on the bond pad 25 and bond pad 26 by known bumping methods, and then subsequently reflow soldered to the conductors 16. In practice, electrical connection of the bond pads 25 and 26 with the conductors 16 may place the integral resistor 32 in series with the appropriate circuitry on the substrate 18.

As would be appreciated by those skilled in the art, the bond pads 25 and 26 shown in FIG. 2 will typically be several of many bond pads on the surface of the interposer 14. All of the bond pads on the interposer 14 need not incorporate integral resistors, as best illustrated by FIG. 1, which shows one bond pad 26 without an integral resistor and one bond pad 25 with an integral resistor 32. The resistance value of any particular resistor 32 can be independently varied from other resistors 32 on the interposer 14. A suitable illustrative value for a termination resistor is about fifty ohms, which can be easily achieved on the surface of the interposer 14 using typical screening, stenciling and curtain coating techniques by forming the resistive layer 36 to have a thickness of about ten to twenty micrometers when using conventional bond pad diameters of about 75 to about 750 micrometers, and available resistor materials (i.e. polymer thick film ink containing carbon particles) with sheet resistivities of about 1 to about 100 kiloohms/square.

In practice, sheet resistivites are normally defined with reference to horizontal resistors. Sheet resistivities normally imply a current flow in the horizontal axes (i.e. x and y direction) of a substrate. However, the integral resistors of the present invention are best described as a vertical resistors with reference to the axes of the substrate. Therefore, in the context of the present invention, sheet resistivities may imply a current flow in the vertical axis (i.e. z direction). The x, y, and z directions refer to the orthogonal axes of a cartesian coordinate system.

FIG. 3 illustrates an electrical connection between the conductor 16 and the respective integral resistor 32 and another electrical connection between the bond pad 26 and corresponding conductor 16. The foregoing electrical connections are made via solder bumps 28. The conductors 16, bond pad 25, and bond pad 26 are preferably made of solderable or solder-wettable materials. If all of the bond pads do not incorporate the series termination resistor 32 of this invention, it will be understood that a nonplanarity equal to the thickness of the resistive layer 36 may be introduced. However, the nonplanarity introduced by the thickness of the resistive layer 36 of this invention may be configured to represent only about ten percent of the total pad height, and therefore falls within typical planarity requirements for surface-mount devices such as the BGA package 10. Furthermore, the nonplanarity can be compensated for by adjusting the solder ball volume on the bond pad 26, inclusion of a conducting layer of equivalent thickness on bond pads 26 lacking the resistor 32, and the like. For example, the bond pad 25 may have a reduced height in comparison to the bond pad 26 as best illustrated in FIG. 1. In alternate embodiments, the solder bumps 24 and/or 28 may be replaced by conductive adhesives.

Figure 4:
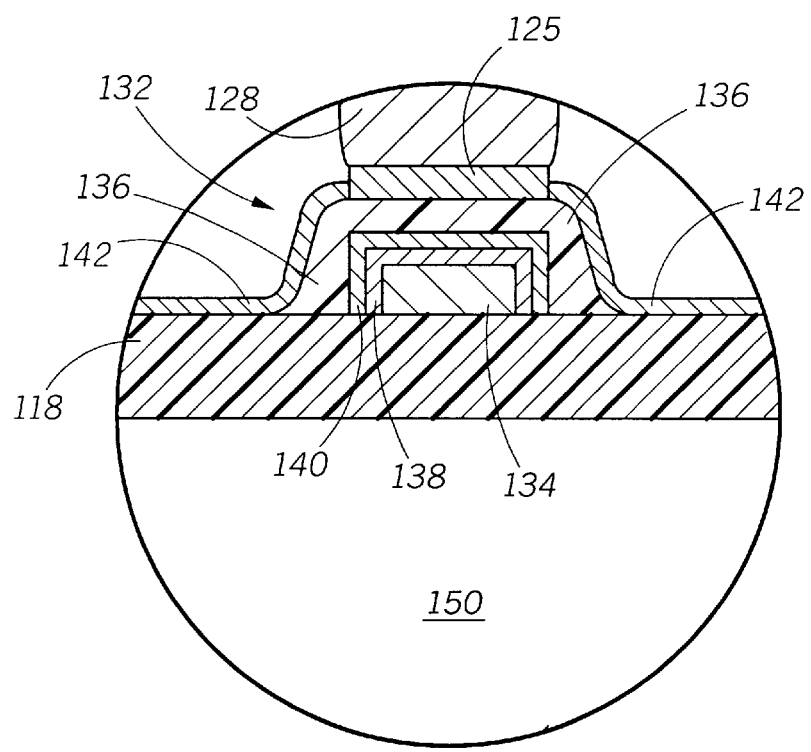
FIG. 4 is a cross-sectional view of a circuit board incorporating an integral resistor associated with a solderable pad.

FIG. 4 shows a circuit board 150 incorporating an integral resistor 132 into a substrate 118. The circuit board 150 or the substrate 118 may be composed of a fiber-filled epoxy (i.e. FR4), an organic resin, a polymeric resin, a flexible circuit board, a ceramic board, or the like.

The integral resistor 132 preferably comprises a terminal 134, a resistive layer 136, and a bond pad 125. The terminal 134 may be embodied as a portion of a metallic (i.e. copper) trace on the substrate 118. The terminal 134 is preferably plated by an intermediate metal layer 138 and a noble metal layer 140. The intermediate metal layer 138 may be referred to as the nickel layer, where the intermediate layer 138 contains nickel. The intermediate layer 138 preferably plates the terminal 134, if the terminal 134 is copper, brass, aluminum, steel, or the like. The noble metal layer 140 optimally plates the intermediate layer 138 and interfaces or contacts at least a portion of the resistive layer 136. The noble metal layer 140 may comprise gold, silver, palladium, platinum, or the like.

The resistive layer 136 of FIG. 4 is substantially similar to the resistive layer 36 of FIG. 1 except that the resistive layer 136 is associated with the substrate 118, while the resistive layer 36 is preferably associated with the interposer 14. Thus, all of the characteristics of the resistive layer 36 and the resistive material, previously described with reference to FIG. 1 through FIG. 3, shall apply to the resistive layer 136 of FIG. 4. Accordingly, the resistive layer 136 optimally comprises a resistive material composed of electrically conductive particles dispersed in a polymeric resin. For example, the electrically resistive material 136 may comprise carbon particles dispersed in a phenolic resin. The resistivity of the resistive layer 136, once cured, optimally falls within a range extending from 5 ohm-centimeters to 100 ohm-centimeters as previously described. The resistive layer 136 may be encapsulated by solder mask or a dielectric as shown in FIG. 4.

A bond pad 125 is deposited on the electrically resistive layer 136. The bond pad 125 is made from a solderable, base material such as nickel or copper. The bond pad 125 interfaces with the electrically resistive layer 136 to form an electrical connection between the electrically resistive layer 136 and the bond pad 125. A solder bump 128 may be bonded to the solderable bond pad 125 to facilitate an external electrical connection.

In an alternate embodiment, the bond pad may include a noble metal layer (not shown) to isolate the bond pad with a corrosion resistant barrier from the electrically resistive layer. The noble metal layer (not shown) contacts or interfaces the electrically resistive layer of the alternate circuit board. In the alternate embodiment, an intermediate metallic layer (not shown), preferably composed of nickel, may be located between a base material of the bond pad and the noble metal layer if the base metal material comprises copper.

While the present invention has been described in terms of particular embodiments, it is apparent that other forms could be adopted by one skilled in the art. For example, the terminals, conductors and resistive materials described could be formed using materials and methods other than those discussed. Furthermore, the teachings of this invention could be applied to various other circuit devices, and are not limited to the microelectronic assembly, the surface-mount device, the circuit board, and the BGA surface-mount device shown in the Figures. Accordingly, the scope of our invention is to be limited only by the following claims.

What is claimed is:

1. A microelectronic assembly comprising:
   a substrate;
   a surface-mount device;
   an electrical connection connecting the surface-mount device to the substrate;
   wherein at least one of said substrate and said surface-mount device comprises a series termination resistor comprising:
   a surface;
   a terminal disposed at the surface;
   a resistive layer of electrically resistive material overlying the terminal and having a resistivity from approximately 5 ohm-centimeters to approximately 100 ohm-centimeters; and
   a bond pad affixed to the electrically resistive material and bonded to the electrical connection, the bond pad electrically coupled to the terminal through the resistive layer.

2. The microelectronic assembly according to claim 1 wherein the series termination resistor is disposed on the substrate.

3. The microelectronic assembly according to claim 1 wherein the series termination resistor is disposed on the surface-mount device.

4. The microelectronic assembly according to claim 1 wherein the bond pad is composed of a solderable metal.

5. The microelectronic assembly according to claim 1 further comprising a solder bump affixed to the bond pad.

6. The microelectronic assembly according to claim 1 wherein the electrically resistive material has a resistivity within a range from approximately 10 ohm-centimeters to approximately 50 ohm-centimeters.

7. The microelectronic assembly according to claim 1 wherein the resistive material comprises a polymeric resin and electrically-conductive particulate filler dispersed in the polymeric resin.

8. The microelectronic assembly according to claim 1 wherein the electrically resistive material comprises a polymeric resin and carbon particles dispersed in the polymer resin.

9. The microelectronic assembly according to claim 1 further comprising a noble metal layer in contact with the resistive layer.

10. The microelectronic assembly according to claim 1 further comprising a first noble metal layer and a second noble metal layer; the first noble metal layer plating the bond pad, the second noble metal layer plating the terminal.

11. A surface-mount device comprising:
    a surface;
    a terminal disposed at the surface;
    a layer of electrically resistive material overlying the terminal and having a resistivity from approximately 5 ohm-centimeters to approximately 100 ohm-centimeters; and
    a bond pad affixed to the electrically resistive material and adapted for an external electrical connection, the bond pad electrically coupled to the terminal through the layer, such that the terminal, the layer, and the bond pad cooperatively form an integral resistor.

12. The surface-mount device according to claim 11 further comprising an interposer and an integrated circuit die mounted on the interposer opposite from the terminal.

13. The surface-mount device according to claim 11 further comprising a solder bump bonded to the bond pad.

14. The surface-mount device according to claim 11 wherein a diameter of the bond pad is within a range extending from approximately 75 micrometers to approximately 750 micrometers.

15. The surface-mount device according to claim 11 wherein the resistive material has a sheet resistivity within a range extending from approximately 1 kiloohms per square to approximately 100 kiloohms per square; and wherein the resistive material has a thickness with a range of approximately 10 to 20 twenty micrometers.

16. The surface-mount device according to claim 11 wherein the resistive material comprises a polymeric resin and electrically conductive particles dispersed in the polymeric resin.

17. The surface-mount device according to claim 16 wherein the conductive particles are composed of carbon particles.

18. The surface mount device according to claim 11 wherein the resistive material comprises a polymer thick-film ink containing electrically conductive particles.

19. The surface mount device according to claim 11 wherein the resistive material comprises carbon particles dispersed in a phenolic resin.

20. The surface-mount device according to claim 11 wherein the terminal is formed of copper and further comprises a nickel layer plated onto the copper and a noble metal layer plated onto the nickel layer.

21. The surface-mount device according to claim 11 wherein the bond pad contains a metal consisting from the group of copper and nickel.

22. The surface mount device according to claim 20 wherein the noble metal layer is formed of a metal selected from the group consisting of gold, silver, and palladium.

23. A ball-grid package comprising:
    an interposer having a first surface and a second surface;
    an integrated circuit die mounted on the first surface; a terminal disposed on the second surface and electrically coupled to the die;
    a layer of electrically resistive material overlying the terminal, said material comprising resin and electrically conductive particles and having a resistivity between 5 and 100 ohm-centimeters;
    a bond pad affixed to the electrically resistive material and electrically coupled to the terminal via the layer to form an integral resistor; and
    a solder bump bonded to the bond pad, the solder bump adapted to receive an electrical connection to the package.

24. The ball-grid array package according to claim 23 wherein the electrically conductive particles comprise carbon particles.

25. The ball-grid array package according to claim 23 wherein the resistive material has a sheet resistivity within a range extending from approximately 1 kiloohms per square to approximately 100 kiloohms per square; and wherein the resistive material has a thickness with a range of approximately ten to approximately twenty micrometers.

26. The ball-grid array package according to claim 23 wherein the resistive material comprises carbon particles dispersed in a phenolic resin.

27. The ball-grid array package according to claim 23 wherein the terminal is formed of copper and further comprising an intermediate layer plated onto the copper and a noble metal layer plated onto the intermediate layer.

28. The ball-grid array package according to claim 27 wherein the noble metal layer contains a metal selected from the group consisting of gold, silver, and palladium.

29. A circuit board comprising:

a substrate;

a terminal disposed on the substrate;

a layer of electrically resistive material overlying the terminal and having a resistivity from approximately 5 ohm-centimeters to approximately 100 ohm-centimeters; and a bond pad affixed to the electrically resistive material and adapted from an external electrical connection, the bond pad electrically coupled to the terminal through the layer, such that the terminal, the layer, and the bond pad cooperatively form an integral resistor.

30. The circuit board according to claim 29 wherein a diameter of the bond pad is within a range extending from approximately 75 micrometers to approximately 750 micrometers.

31. The circuit board according to claim 29 wherein the resistive material has a sheet resistivity within a range extending from approximately 1 kiloohms per square to approximately 100 kiloohms per square; and wherein the resistive material has a thickness with a range of approximately 10 to 20 micrometers.

32. The circuit board according to claim 29 wherein the resistive material comprises a polymeric resin and an electrically conductive particulate filler dispersed in the polymeric resin.

33. The circuit board according to claim 29 wherein the resistive material comprises electrically conductive particles dispersed in a polymer thick-film ink.

34. The circuit board according to claim 33 wherein the electrically conductive particles are composed of carbon particles.

35. The circuit board according to claim 29 wherein the resistive material comprises a phonolic resin and carbon particles, dispersed in the phenolic resin.

36. The circuit board according to claim 29 wherein the terminal is composed of a copper layer; the circuit board further comprising a nickel layer and a noble metal layer, the nickel layer plated onto the copper layer and the noble metal layer plated onto the nickel layer, the noble metal layer interfacing the layer of the resistive material.

37. The circuit board according to claim 29 wherein the bond pad comprises a nickel layer for interfacing the layer of the resistive material.

38. The circuit board according to claim 36 wherein the noble metal layer contains a metal selected from the group consisting of gold, silver, and palladium.

* * * * *